United States Patent [19]
Friedli et al.

[11] Patent Number: 4,556,506
[45] Date of Patent: Dec. 3, 1985

[54] AQUEOUS ELECTROCONDUCTIVE COMPOSITIONS

[75] Inventors: Hans R. Friedli, Lake Jackson; Philip Y. Lau, Houston, both of Tex.

[73] Assignee: The Dow Chemical Company, Midland, Mich.

[21] Appl. No.: 682,961

[22] Filed: Dec. 18, 1984

[51] Int. Cl.$^4$ ............................................. H01B 1/22
[52] U.S. Cl. .................................. 252/512; 252/500; 252/513; 428/901; 523/137
[58] Field of Search ...................... 252/500, 512, 513; 428/901; 523/137

[56] References Cited

U.S. PATENT DOCUMENTS

| | | | |
|---|---|---|---|
| 3,636,052 | 1/1972 | Hatch et al. | 528/212 |
| 3,749,737 | 7/1973 | Hatch et al. | 528/219 |
| 3,749,738 | 7/1973 | Hatch et al. | 528/212 |
| 3,749,739 | 7/1973 | Hatch et al. | 528/212 |
| 3,989,644 | 11/1976 | Bolon et al. | 252/513 |
| 4,371,459 | 1/1983 | Nazarenko | 252/513 |

*Primary Examiner*—Prince E. Willis
*Assistant Examiner*—Robert A. Wax
*Attorney, Agent, or Firm*—James G. Carter

[57] ABSTRACT

Aqueous electroconductive compositions comprising (A) a partially hydrolyzed polyacrylamide, (B) a difunctional zwitterion, (C) a surfactant, (D) metallic flakes or powders and (E) water can be employed as conductive coating for electromagnetic shielding and radiofrequency shielding.

9 Claims, No Drawings

AQUEOUS ELECTROCONDUCTIVE COMPOSITIONS

BACKGROUND OF THE INVENTION

The present invention concerns aqueous or water borne electroconductive coating compositions.

Electroconductive coating formulations which are commercially available usually contain volatile organic solvents which cause pollution of the atmosphere during application or require expensive solvent recovery systems. The present invention provides for aqueous electroconductive coating composition.

SUMMARY OF THE INVENTION

The present invention pertains to aqueous electroconductive coating compositions comprising
  (A) from about 0.3 to about 15, preferably from about 3 to about 6 weight percent of a difunctional zwitterion which is homopolymerizable and copolymerizable;
  (B) from about 5 to about 20, preferably from about 8 to about 12 percent by weight of a partially hydrolyzed polyacrylamide;
  (C) from about 0.5 to about 20, preferably from about 1 to about 3 weight percent of a non-ionic surfactant having an HLB value of from about 11 to about 15, preferably about 13;
  (D) from about 20 to about 60, preferably from about 40 to about 60 percent by weight of metallic particles selected from flakes and powders of Ni, Cu, or combinations thereof; and
  (E) balance water to provide 100% of total composition by weight.

DETAILED DESCRIPTION OF THE INVENTION

Suitable dispersants which can be employed herein include partially hydrolyzed polyacrylamides containing from about 2 to about 30, preferably from about 6 to about 10 percent hydrolysis and a weight average molecular weight of from about 100,000 to about 1,000,000, preferably from about 200,000 to about 500,000.

Suitable partially hydrolyzed polyacrylamides include those which are from about 2 to about 30, preferably from about 6 to about 10 percent hydrolyzed and can be prepared by polymerization of a 20% acrylamide monomer mixture at a pH of about 9, using a metabisulfite/persulfate initiator system, at 80° C. for one hour (3600 s), followed by stoichiometric hydrolysis with caustic for about 30 min. (1800 s) at 80° C.

Suitable zwitterions which can be employed herein include those represented by the formula

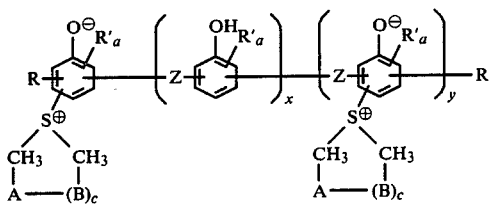

wherein each R individually is H, Cl, Br, OH, or —OC$_1$—C$_4$ alkyl; each R' individually is H, Cl, Br, or C$_1$—C$_4$ alkyl and a is 1 or 2; each sulfonium group is ortho or para to a phenolic oxygen; each A and B individually are —CH$_2$— or —CHR'— and c is 1 or 2; Z is —C(C$_1$—C$_4$ alkyl)$_2$— and $\Sigma(x+y)=1$.

Suitable such polymerizable zwitterions are disclosed by Hatch et al in U.S. Pat. Nos. 3,636,052; 3,660,431; 3,749,737; 3,749,738; and 3,749,739 which are incorporated herein by reference.

Suitable surfactants include polyglycol ethers, polyglycol esters, esters, phosphates, amides, sulfates, alkyl or aryl poly(alkoxy) alcohols or amides, glycerol monoesters or amides, sorbitol monoesters or amides, t-acetylenic alcohols or diols and their alkoxylates. Particularly suitable surfactants include the nonyl phenoxy poly(ethyleneoxy)ethanols such as those represented by the formula

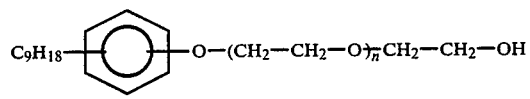

| where | n = | HLB value = |
|---|---|---|
| | 6 | 10.8 |
| | 9 | 13 |
| | 15 | 15 |

These alkyl phenoxy poly(alkyleneoxy)ethanols are commercially available from GAF Corporation under the tradename IGEPAL/CO. Other suitable surfactants are tertiary acetylenic glycols, such as those sold under the tradename of SURFYNOLS by Air Products and Chemicals, Inc.

Suitable electrically conductive materials which can be employed herein include flakes or powders of such metals as nickel, copper, aluminum, combinations thereof and the like.

Suitable non-conductive substrates which can be employed herein to prepare electromagnetic and radiofrequency shielding include, for example, polystyrene, copolymers of styrene, polycarbonates, polyethylene, polysulfones, polyoxyphenes, combinations thereof and the like.

The present invention is useful in the preparation of conductive adhesives, printed circuits, conductive inks, electromagnetic and radiofrequency shielding, conductive tapes and the like.

The following examples are illustrative of the invention.

EXAMPLE 1

A. Preparation of Zwitterion

Anhydrous HCl was passed for 90 min. through a solution of 50 pts. (0.22 mole) bisphenol A (4,4'-isopropylidenebisphenol) and 50 pts. (0.48 mole) tetrahydrothiophene oxide in about 570 pts. refluxing liquid SO$_2$ (B.P. −10° C.). Evaporation of the SO$_2$ gave a gummy product which was triturated with ether and a solid sulfonium salt recovered.

The bisphenol tetramethylene sulfonium chloride was dissolved in anhydrous methanol and an equivalent of 1 N NaOCH$_3$ in methanol added. The resulting mixture was cooled, the precipitated NaCl removed by filtration, and then the filtrate was concentrated under reduced pressure to yield 72 pts. (90% yield on bisphenol A) of a solid tetramethylene sulfonium zwitterionic monomer containing an average of 1.58 sulfonium groups per molecule.

B. Preparation of Aqueous Electroconductive Composition

A partially (8.4%) hydrolyzed, 20.7% aqueous solution of a polyacrylamide resin having a molecular weight corresponding to a viscosity of 17,000 cps was mixed with a 20% by weight aqueous solution of the zwitterion prepared in A above. After diluting with water, a surfactant (SURFYNOL 104, from Air Products Company) was added. Then nickel flake (grade HCT from Novamet Company) was dispersed therein resulting in an aqueous electroconductive composition having good shelf stability, about two to three months without any significant changes in viscosity and dispersion. The composition contained the following:

2.14 pbw* polyacrylamide
8.15 pbw zwitterion monomer
3.97 pbw surfactant
45.00 pbw nickel flakes
40.39 pbw water

*pbw is percent by weight

EXAMPLE 2

The formulation from Example 1 was brushed onto a polystyrene polymer (STYRON 6087 SF resin, The Dow Chemical Company) plaque to obtain a 3 mil coating (dry). The coating was cured 20 minutes at 60° C.

The electroconductive coating was tested for hardness (ASTM D-3363), adhesion (ASTM D-3359) and electrical resistivity (ASTM F-43). Water sensitivity was tested qualitatively by placing a drop of water onto the coating.

Water insensitivity was indicated by the lack of water penetration and continued "beading". Results of the hardness, adhesion and electrical resistivity evaluations are in the following table. Both of the samples passed the water sensitivity test.

| Coating | Thickness (cm) | Resistivity ($\Omega$ cm) ASTM F-43 | Hardness ASTM D-3363 | Adhesion ASTM D-3359 |
|---|---|---|---|---|
| Example 1A[1] | 0.009 | $3.42 \times 10^{-1}$ | 2H | 5A |
| Example 1B[1] | 0.008 | $4.31 \times 10^{-2}$ | 2H | 5A |

[1]Example 1A was cured at 60° C. for 20 minutes (1200 s).
Example 1B was cured at 180° C. for 20 minutes (1200 s).

We claim:

1. An aqueous electroconductive coating composition comprising
   (A) from about 0.3 to about 15, weight percent of bisphenol A tetramethylene sulfonium zwitterionic monomer;
   (B) from about 5 to about 20, percent by weight of polyacrylamide, weight average molecular weight of 200,000 to 500,000, hydrolyzed 6–10% and present as an alkali metal salt;
   (C) from about 0.5 to about 20, weight percent of a non-ionic surfactant having an HLB value of from about 11 to about 15;
   (D) from about 20 to about 60, percent by weight of metallic particles selected from flakes and powders of Ni, Cu, Al or combinations thereof; and
   (E) balance water to provide 100% of total composition by weight.

2. An electroconductive coating composition of claim 1 wherein
   (i) component (A) is present in quantities of from about 3 to about 6 percent by weight;
   (ii) component (B) is present in quantities of from about 8 to about 12 percent by weight;
   (iii) component (C) is present in quantities of from about 1 to about 3 percent by weight;
   (iv) component (D) is present in quantities of from about 40 to about 60 percent by weight.

3. An electroconductive coating of claim 2 wherein
   (i) component (C) is 2,4,7,9-tetramethyl-4,7-dihydroxy-5-decyne and
   (ii) component (D) is nickel or copper.

4. A product comprising a non-electroconductive substrate coated with a composition of claim 1.

5. A product of claim 4 wherein said substrate is a polymer containing polymerized styrene.

6. A product comprising a non-electroconductive substrate coated with a composition of claim 2.

7. A product of claim 6 wherein said substrate is a polymer containing polymerized styrene.

8. A product comprising a non-electroconductive substrate coated with a composition of claim 3.

9. A product of claim 8 wherein said substrate is a polymer containing polymerized styrene.

* * * * *